(12) United States Patent
Supplieth

(10) Patent No.: US 10,916,446 B2
(45) Date of Patent: Feb. 9, 2021

(54) USE OF WAFER BRIGHTNESS TO MONITOR LASER ANNEAL PROCESS AND LASER ANNEAL TOOL

(71) Applicant: X-FAB Texas, Inc., Lubbock, TX (US)

(72) Inventor: Frank Supplieth, Lubbock, TX (US)

(73) Assignee: X-FAB TEXAS, INC., Lubbock, TX (US)

( * ) Notice: Subject to any disclaimer, the term of this patent is extended or adjusted under 35 U.S.C. 154(b) by 25 days.

(21) Appl. No.: 16/356,152

(22) Filed: Mar. 18, 2019

(65) Prior Publication Data

US 2019/0287814 A1    Sep. 19, 2019

(30) Foreign Application Priority Data

Mar. 16, 2018 (GB) .................................. 1804232.5

(51) Int. Cl.
| | |
|---|---|
| H01L 21/477 | (2006.01) |
| H01L 21/268 | (2006.01) |
| B23K 26/08 | (2014.01) |
| B23K 26/352 | (2014.01) |
| B23K 26/03 | (2006.01) |
| B23K 26/082 | (2014.01) |

(Continued)

(52) U.S. Cl.
CPC ........ *H01L 21/477* (2013.01); *B23K 26/0006* (2013.01); *B23K 26/032* (2013.01); *B23K 26/082* (2015.10); *B23K 26/0861* (2013.01); *B23K 26/352* (2015.10); *B23K 26/355* (2018.08); *H01L 21/268* (2013.01); *H01L 22/12* (2013.01); *B23K 2101/40* (2018.08); *B23K 2103/56* (2018.08)

(58) Field of Classification Search
None
See application file for complete search history.

(56) References Cited

U.S. PATENT DOCUMENTS

| | | |
|---|---|---|
| 4,380,864 A | 4/1983 | Das |
| 6,073,464 A | 6/2000 | Boher et al. |

(Continued)

FOREIGN PATENT DOCUMENTS

JP    2013-235915    11/2013

OTHER PUBLICATIONS

Combined Search and Examination Report dated Aug. 15, 2018 in corresponding GB Application No. 1804232.5, 6 pages.

(Continued)

*Primary Examiner* — Moazzam Hossain
*Assistant Examiner* — Stanetta D Isaac
(74) *Attorney, Agent, or Firm* — Nixon & Vanderhye PC

(57) ABSTRACT

A method is provided for monitoring the laser annealing of a semiconductor wafer. After annealing, images of many regions of the wafer are captured. The surface brightness of these regions is measured by computer, and statistics of these surface brightness measurements are determined, such as their mean and their standard deviation. Using a correlation between the surface brightnesses and the electrical resistance of the annealed wafer, the surface brightness statistics can be used to determine whether the annealing process resulted in a wafer that meets end user specifications. The surface brightness statistics can also be used to monitor the annealing tool, both during manufacturing and periodically or following maintenance.

14 Claims, 7 Drawing Sheets

(51) Int. Cl.
  *H01L 21/66*   (2006.01)
  *B23K 26/00*   (2014.01)
  *B23K 103/00*  (2006.01)
  *B23K 101/40*  (2006.01)

(56) References Cited

U.S. PATENT DOCUMENTS

| | | |
|---|---|---|
| 6,166,354 A | 12/2000 | Hause et al. |
| 6,815,229 B1 | 11/2004 | Halliyal et al. |
| 2004/0077149 A1 | 4/2004 | Renau |
| 2005/0036190 A1 | 2/2005 | Tanaka |
| 2007/0173039 A1 | 7/2007 | Tagusa |
| 2013/0140288 A1 | 6/2013 | Yu et al. |
| 2013/0196455 A1 | 8/2013 | Shen et al. |
| 2013/0330847 A1 | 12/2013 | Tsai et al. |
| 2013/0341310 A1* | 12/2013 | Van Der Wilt .... G01N 21/4788 219/121.62 |
| 2015/0247808 A1 | 9/2015 | Van Der Wilt |
| 2016/0093539 A1 | 3/2016 | Nakanishi et al. |
| 2017/0229307 A1 | 8/2017 | Kido |

OTHER PUBLICATIONS

International Search Report and Written Opinion dated Jun. 18, 2019 in corresponding PCT Application No. PCT/GB2019/050748.

\* cited by examiner

USE OF WAFER BRIGHTNESS TO MONITOR LASER ANNEAL PROCESS AND LASER ANNEAL TOOL

This application claims priority to GB 1804232.5 filed Mar. 16, 2018, the entire contents of each of which is hereby incorporated by reference.

FIELD OF INVENTION

This invention relates to laser annealing of semiconductor wafers, and more particularly to monitoring the quality of laser annealed wafers.

BACKGROUND

Annealing of a semiconductor wafer is a step in the manufacture of the wafer. Annealing serves to activate dopant material, thereby modifying the electrical properties of the wafer. Annealing has been historically performed using furnace annealing or rapid thermal annealing. However, another method of semiconductor wafer annealing is by laser annealing.

In laser annealing, an XY-scanner is used to direct a laser beam to various parts of the surface of a wafer. The laser beam is swept over a small portion, called a block, of the surface of the wafer (about a 25 mm×25 mm square in the case of the IX-6100™ tool by IPG Photonics Corporation), resting momentarily at each of many spots on the surface in order to heat that spot. After each spot on the surface of the wafer is heated, the XY-scanner directs the laser beam to the next spot for annealing. A stage on which the wafer rests is then moved relative to the XY-scanner, and the laser beam is swept over a new portion of the wafer surface.

A process camera has a focus fixed on the same focal point of the laser, and allows the stage to be moved vertically such that the focus of the process camera, and hence also the focus of laser, lies on the surface of the wafer.

The momentary resting of the laser beam on each spot of the surface of the wafer causes the surface to have an anneal pattern. Example anneal patterns of SiC wafers (W1, W2, W3, and W4) are shown in FIG. 1. Each pair of vertically aligned photographs shows the anneal pattern for a different wafer, the upper photograph of each pair showing the anneal pattern at the center of a block on the respective wafer and the lower photograph showing the anneal pattern at the edge of a block on the respective wafer]. The anneal pattern is not uniform between the wafers, nor is it uniform across the surface of each wafer, possibly because of a lack of stability of the anneal process in this case. However, the lack of uniformity may not be obvious to an observer.

For a particular wafer recipe, specifying the desired electrical properties of the wafer and typically provided by a customer who will use the wafer, the manufacturer of the wafer sets the laser power, the laser focus, and the resting time of the laser on each spot (collectively referred to herein as the anneal process properties). After the annealing process, the surface of the wafer is inspected visually by human eye. The uniformity of the anneal pattern over the wafer indicates the uniformity of the electrical properties of the wafer. Since only a section of the entire wafer is actually used, this visual gauge of the uniformity of the surface can also be used to select a section with higher uniformity. The uniformity of the anneal pattern between wafers can also be used to judge the uniformity of electrical properties between wafers.

RSD(on) measurement by a customer provides the electrical properties of the wafer, and this feedback can be used by a manufacturer of the wafer to alter the anneal process properties in order to obtain the desired electrical properties. However, this feedback can take weeks to obtain.

Furthermore, visual inspection by the human eye does not allow for objective assessment of the anneal pattern of a wafer for uniformity. Review of the anneal pattern in this way provides at best a qualitative evaluation of the anneal process.

Finally, visual inspection using the human eye is slow. It is impractical to inspect the over four thousand 2000 μm×2000 μm images typical of a wafer, let alone inspect such a large number of images for an entire lot of wafers, and it close to impossible to recognize process variations (e.g. instability in the anneal process) before they influence product quality.

There is a need for a method of inspecting semiconductor wafers after laser annealing which provides objective and automatic evaluation of the anneal pattern of a wafer and determines the electrical properties of the wafer from the anneal pattern. Such a method would allow the anneal process properties, and in fact the anneal tool itself, to be altered by the wafer manufacturer in a much shorter time than allowed by visual inspection and reliance of customer feedback.

SUMMARY

According to one embodiment of the invention, a method is provided for monitoring a laser annealing process of a semiconductor wafer. A wafer is laser annealed using a laser. Illumination conditions are ensured to be at predefined conditions. A number of surface brightnesses of the wafer are measured, each measurement being at a different portion of the wafer. Brightness statistics of the measured surface brightnesses are determined. The brightness statistics are used to determine whether the wafer exhibits desired electrical characteristics.

According to another embodiment of the invention, a method is provided for monitoring a laser annealing tool. A number of portions of a bare Si wafer are annealed, each at a different focus offset. The surface brightness of each portion is measured, thereby associating each focus offset with one of the measured surface brightnesses. The focus offset associated with a minimum of the surface brightnesses is determined. If this focus offset is other than zero, then the focus of the laser in the tool is adjusted by an amount equal to the focus offset.

In one embodiment, the alignment of a galvanometer used to direct the laser beam is monitored. A number of blocks on the wafer are laser annealed. The surface brightness of each of a number of portions of the wafer is measured. Brightness statistics of each block are determined of the measured surface brightness of the portions within the block. If the brightness statistics of no block indicates that the block exhibits desired characteristics, then mirrors in the galvanometer are adjusted so as to sweep the laser beam symmetrically.

The measurement of surface brightnesses of a wafer allows an objective quantification of properties of the annealed wafer to be made, and allows the quantification to be made quickly. The surface brightness and the electrical resistance of an annealed wafer are correlated, and so a quick and objective evaluation of the quality of the annealed wafer is possible. Measurement and quantification of the surface brightnesses also allows objective and quick monitoring of the laser annealing tool, thereby allowing rapid adjustment of the tool, if needed, relative to visual inspection of annealed wafers. A bare test wafer can even be used, and an objective and quantifiable assessment of the laser annealing tool can be made quickly outside a manufacturing run, allowing for rapid adjustment of the tool if needed.

BRIEF DESCRIPTION OF THE DRAWINGS

The features and advantages of embodiments of the invention will become more apparent from the following detailed description of the preferred embodiment(s) with reference to the attached figures, wherein.

It is noted that in the attached figures, like features bear similar labels.

DETAILED DESCRIPTION OF THE PREFERRED EMBODIMENTS

Figure 2:
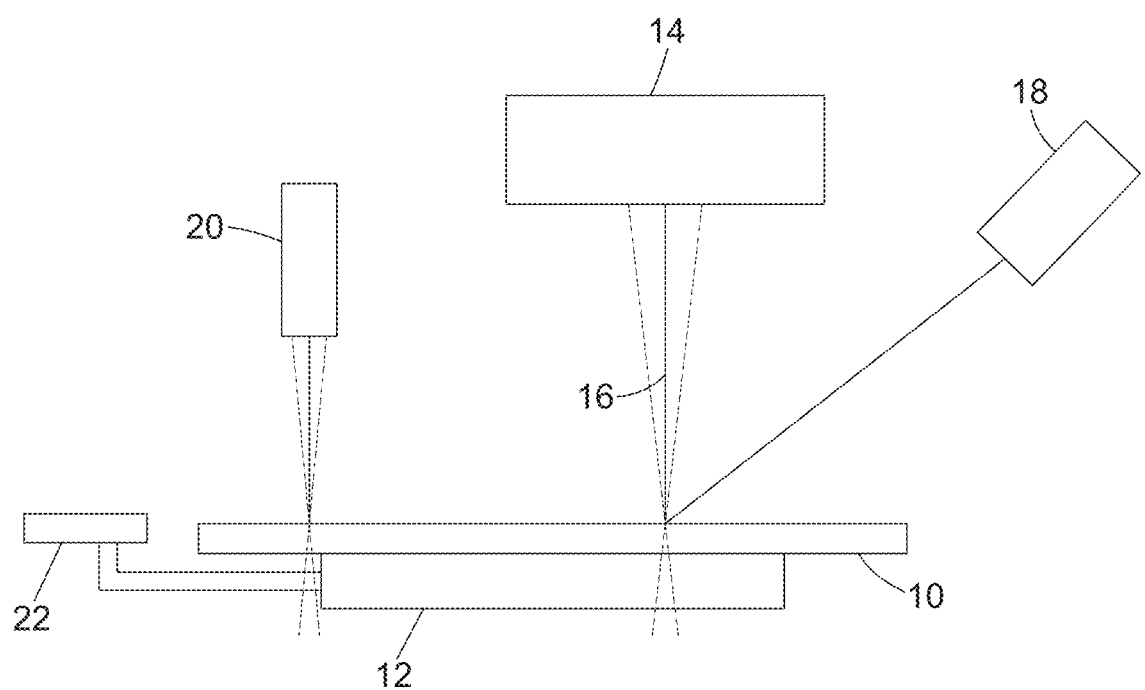
FIG. 2 shows apparatus used in monitoring of annealing of a semiconductor wafer according to one embodiment of the invention.

Referring to FIG. 2, apparatus used in monitoring annealing of a semi-conductor wafer according to one embodiment of the invention is shown. A semiconductor wafer 10 rests on a stage 12. The stage 12 can be moved horizontally in an XY-plane, and vertically in a Z-direction. A galvanometer 14 directs a laser beam 16 of fixed focal length towards the surface of the wafer 10, and can steer the laser beam using XY-mirrors. A process camera 18 of fixed focal length views the surface of the wafer 10 at the location at which the laser beam 16 strikes the surface of the wafer 10. An inspection camera 20 can be moved relative to the galvanometer 14 and to the stage 12, and is used to inspect various points on the surface of the wafer 10. An auxiliary target 22, comprising an unannealed wafer of Si, is attached to the stage 12.

Broadly, a wafer is annealed using a laser. Illumination conditions are ensured to be at predefined conditions. A plurality of surface brightnesses are measured, each surface brightness measurement being made at a different portion of the wafer. Brightness statistics of these measurements are determined, and using these brightness statistics it is determined whether the annealed wafer exhibits desired electrical characteristics.

Figure 1:
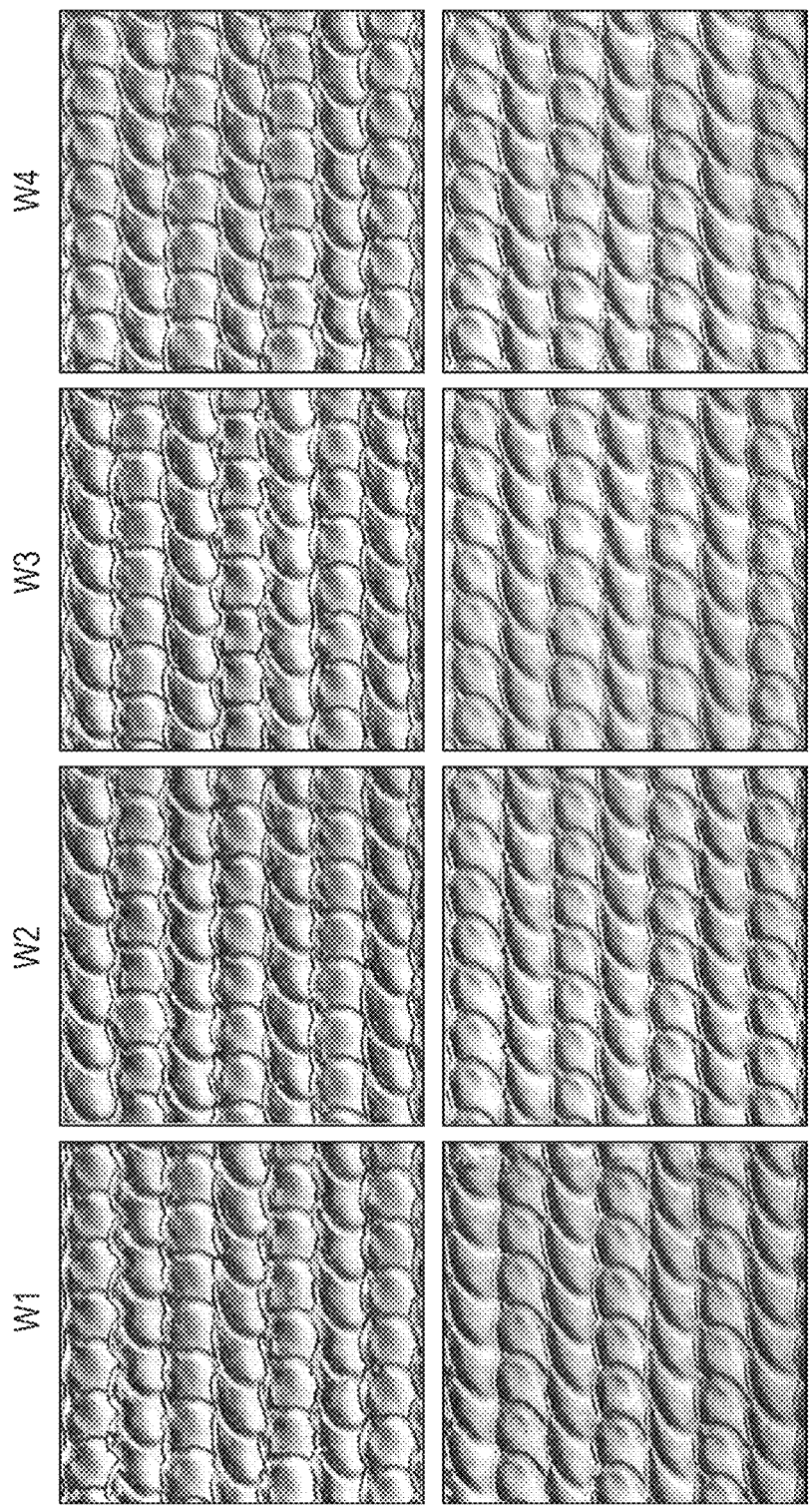
FIG. 1 shows example photographs of portions of different wafers following laser annealing.
Figure 3:
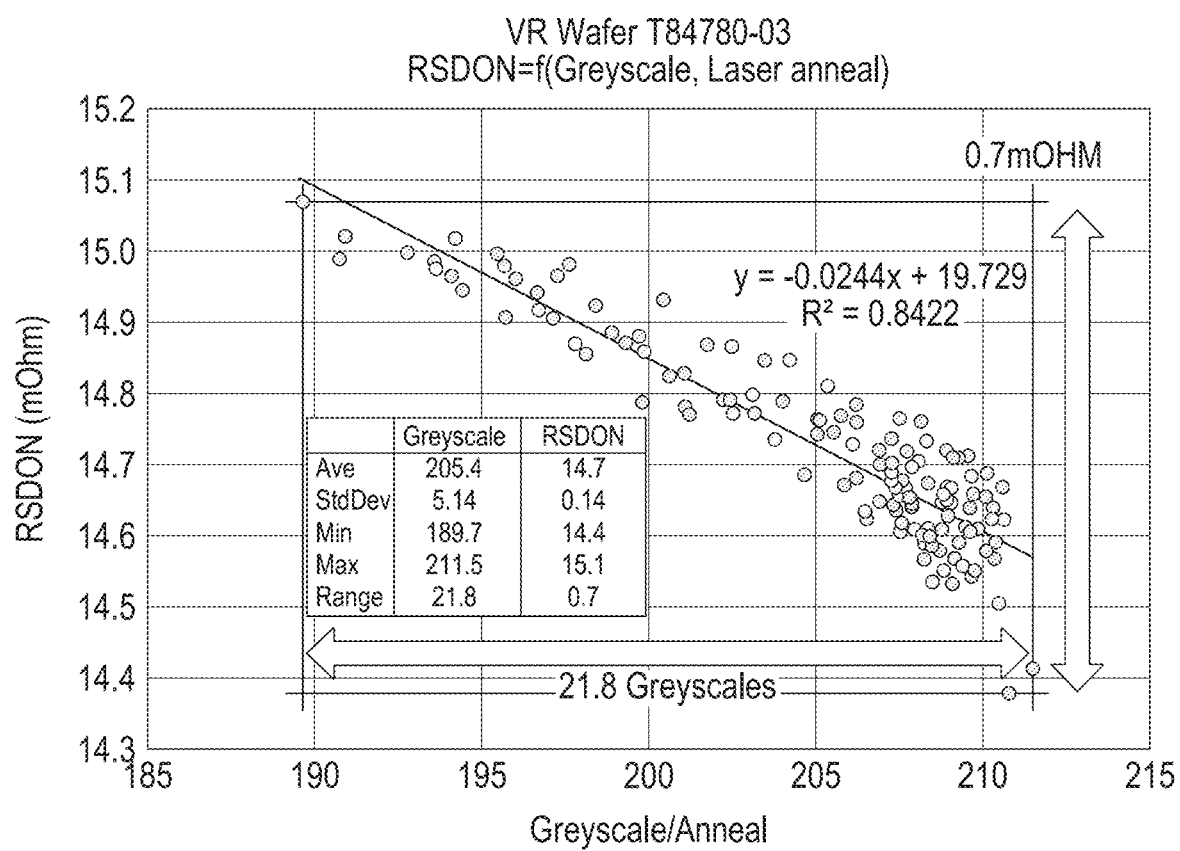
FIG. 3 shows an example graph of electrical resistance versus brightness for numerous regions on a laser annealed wafer.

Laser annealing causes the surface of the wafer to change visual properties, as seen in the example photographs of FIG. 1. There turns out to be a fairly linear correlation between surface brightness of the wafer and the RSD(on) of the wafer. This is seen in FIG. 3, which shows an example graph of electrical resistance versus brightness for numerous regions on a laser annealed wafer. The brightness is expressed in units of greyscale. As can be seen, a brighter region of the surface correlates generally with a lower electrical resistance.

When a semiconductor wafer is manufactured, a customer normally provides specifications setting out the desired electrical resistance of the wafer, such as 15+/−2 mOhm. Using the correlation between electrical resistance and surface brightness for the type of wafer being manufactured, a measure of the surface brightness can indicate the electrical resistivity of the wafer. More importantly, the tolerance limits specified by the customer can be converted into a brightness tolerance measurable by the manufacturer of the wafer. Furthermore, if the surface brightness measurements can be performed without the need for human visual evaluation of the wafer surface, then the electrical resistance of the wafer can be determined quickly and objectively. Fortunately, wafer manufacturing tools usually provide the ability to measure surface brightness using macros and the inspection camera. For example, the operating software for the IX6100™ includes the <Vision Basic Statistic> macro, which provides a mean measured brightness over several regions imaged by the image camera and the standard deviation of the measured brightnesses.

Figure 4:
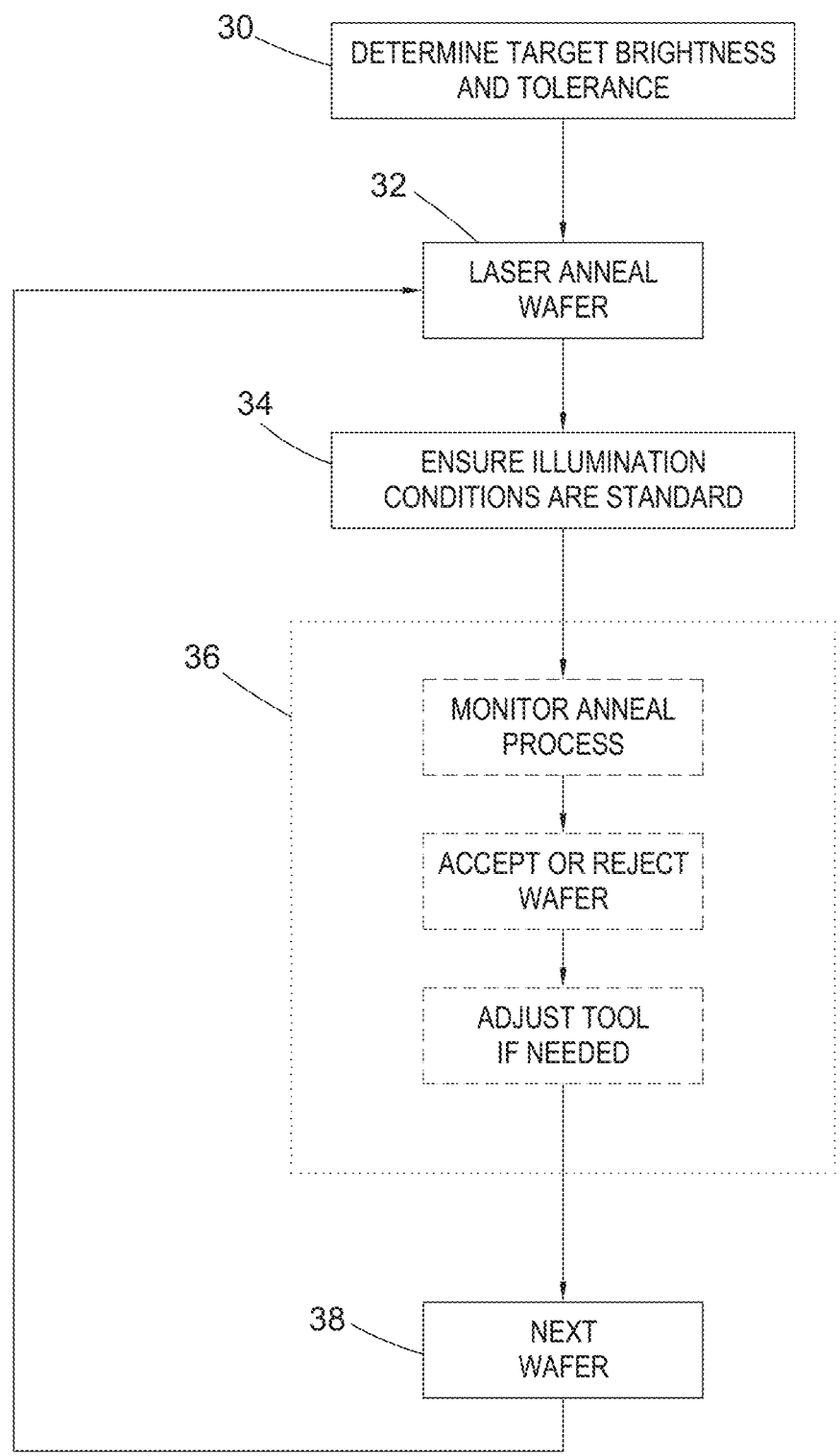
FIG. 4 shows a flowchart of a method by which the quality of laser annealing of a semi-conductor wafer is monitored according to one embodiment of the invention.

Referring to FIG. 4, a flowchart of a method by which the quality of laser annealing of a semiconductor wafer is monitored according to one embodiment of the invention is shown. At step 30 desired characteristics of the wafer are determined. These are determined from the desired electrical resistance and electrical resistance tolerance, usually provided by a customer of the wafer, and a correlation between brightness and electrical resistance for the type of wafer being manufactured. This correlation may have been determined long in advance, based on measured electrical resistance and measured surface brightness of a sample wafer. The desired characteristics of the wafer are in the form of a target brightness and a brightness tolerance.

At step 32 the wafer is laser annealed. The laser annealing process has several properties, including laser power, laser focus, galvanometer alignment, and laser resting time ("the anneal process properties").

The surface brightness of the annealed wafer will depend on the illumination conditions under which the surface is viewed. The actual illumination conditions may change over time. At step 34 the illumination conditions are ensured to be at predefined conditions. The auxiliary target is a bare Si wafer of known surface brightness for a particular illumination. In order to ensure the stability of the illumination conditions, the auxiliary target is illuminated and its surface brightness measured. If the measured surface brightness of the auxiliary target is different from an expected surface brightness by more than a threshold amount, then the illumination conditions are altered. This is repeated until the measured surface brightness of the auxiliary target is within the threshold amount of the expected surface brightness.

At step 36, the success of the annealing process and of the functioning of the annealing tool are evaluated. Broad sub-steps of this step are depicted in FIG. 4, but the step is described in greater detail below with respect to FIG. 5. At step 38 another wafer is selected for annealing, but of course the annealing process may stop instead.

Figure 5:
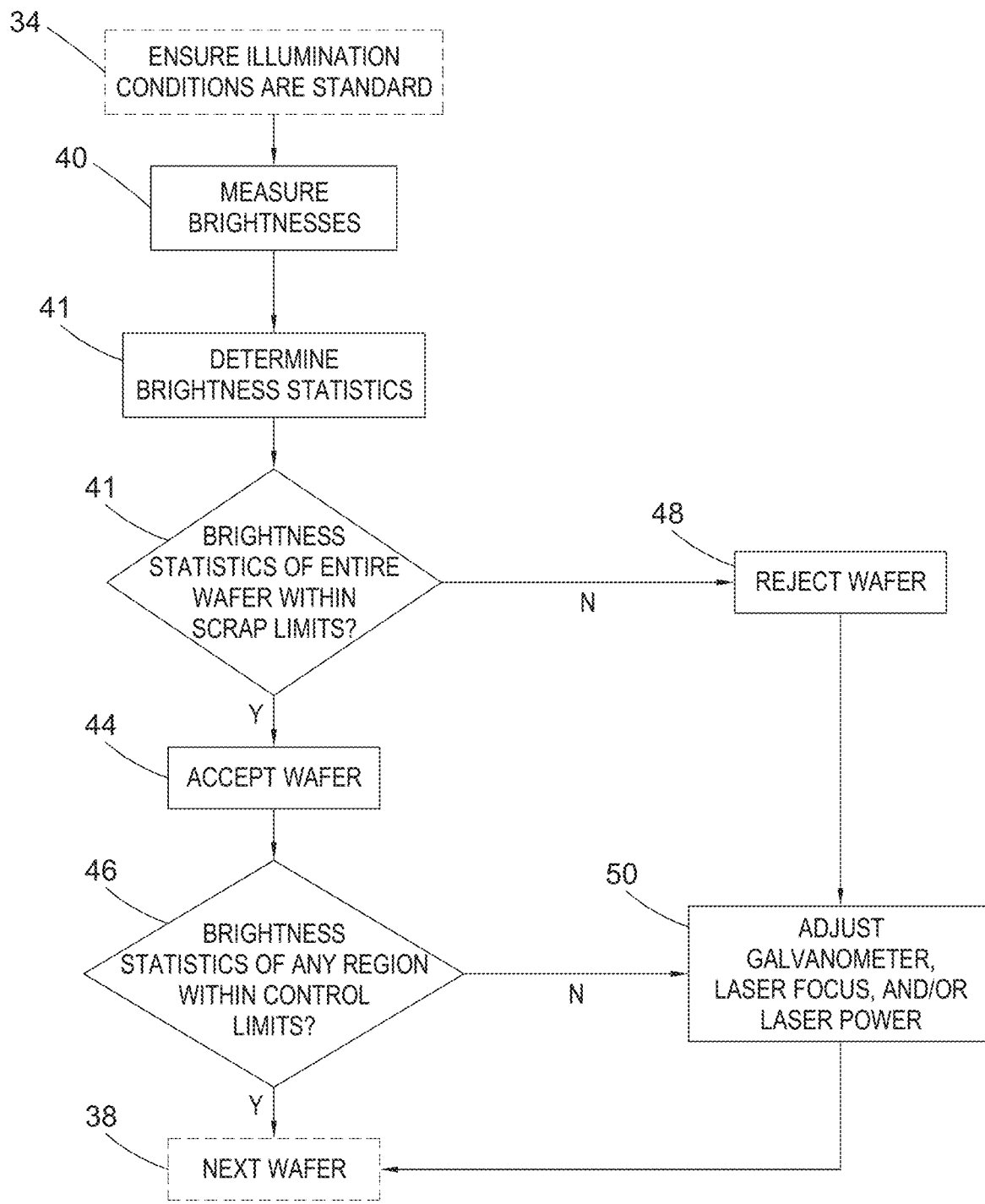
FIG. 5 shows a flowchart of details of the evaluation step of FIG. 4 according to one embodiment of the invention.

Referring to FIG. 5, details of the step 36 of evaluating the annealing process and the functioning of the annealing tool according to one embodiment of the invention are shown. At step 40 a plurality of surface brightnesses are measured. An image of each of multiple regions of the wafer is captured by the inspection camera. This is done by rapidly moving the stage in a pattern in the XY-plane. The image capture rate and field of view size are flexible can be modified. At a step size between image captures of 4167 µm and a capture time of 0.4 ms, a 25 mm×25 mm anneal block can be imaged entirely within 15 seconds. The brightness of each image is quantified by a computer system, resulting in an objective measurement of the surface brightnesses.

At step 41 the brightness statistics of the captured images are determined. Given the large number of images, a computer system is used. By automating the determination of the brightness statistics, these statistics can be determined quickly and objectively. The brightness statistics include at least the mean of the measured brightness for each block and the standard deviation of the measured brightnesses for each block. The brightness statistics also include at least the mean of the measured brightnesses over the entire wafer and the standard deviation of the measured brightnesses over the entire wafer.

Due to the correlation between the surface brightness and the electrical resistance of the wafer, the surface brightness of the wafer can be used to determine whether the annealed wafer exhibits the desired characteristics, i.e. meets the electrical resistance requirements. At step 42 it is determined whether the brightness statistics indicate that the annealed wafer exhibits the desired characteristics, and is therefore acceptable. The annealed wafer is acceptable if the measured brightnesses indicate that the electrical resistances are within first limits, called the scrap limits. This is indicated by the mean of the measured brightness of the entire wafer being within the brightness tolerance of the target brightness, and the standard deviation of the measured brightnesses of the entire wafer being below a threshold. If such is the case, then the wafer is determined to be acceptable at step 44. Alternatively, other brightness statistics may also be used in determining whether an annealed wafer is acceptable, such as the maximum brightness of all anneal blocks and the minimum brightness of all anneal blocks being within the brightness tolerance of the target brightness If the brightness statistics indicate at step 42 that the wafer is not acceptable, then the wafer is rejected at step 48.

The manufacturing process also has second limits regarding electrical resistance or, given the roughly linear relationship between surface brightness and electrical resistance, the surface brightness. The second limits are called the control limits. Broadly, the control limits are used to determine whether the tool used in the annealing process needs to be adjusted, even if a wafer is acceptable. If the wafer was accepted because the measured brightnesses indicate that the electrical resistances are within the scrap limits of the manufacturing process, then at step 46 the control limits are considered. The measured surface brightnesses of multiple blocks are considered. The blocks each contain many regions, but are each only a part of the entire wafer. If any block is found having acceptable brightness statistics, then the anneal process is deemed successful and the anneal process proceeds to the next wafer at step 38. Acceptable brightness statistics are similar to what is described above for the entire wafer, but the brightness measurements over only each of the blocks is considered. In other words, if the mean of the measured brightness of a particular block is within the brightness tolerance of the target brightness, and the standard deviation of the measured brightnesses over the block is below a threshold, then the block is considered acceptable.

If no block is found at step 46 to have acceptable brightness statistics, then at step 50 the galvanometer, the laser focus, and/or the laser power is adjusted, as described below with reference to FIG. 6. A new wafer is then selected at step 38 for annealing.

Figure 6:
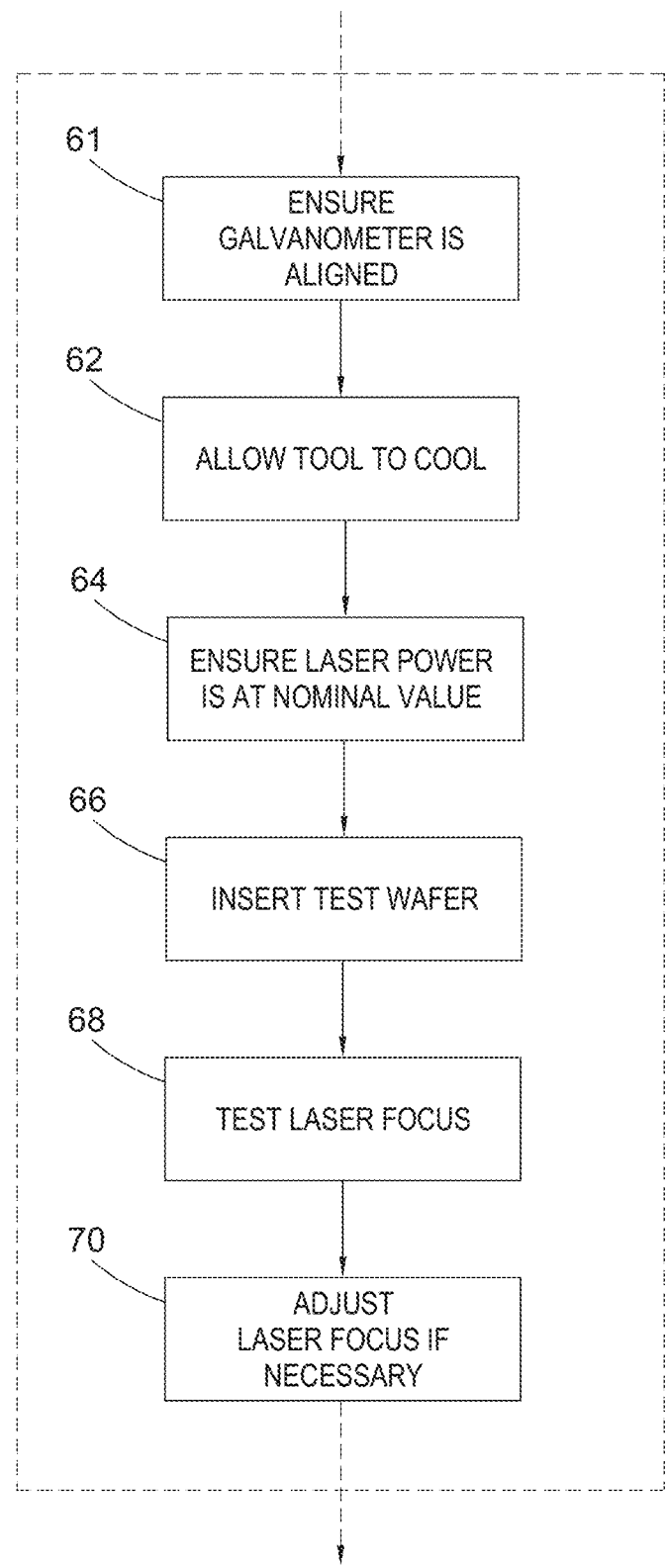
FIG. 6 shows a flowchart of details of the adjustment step of FIG. 5 according to one embodiment of the invention.

Referring to FIG. 6, a flow chart showing details of the step 50 of adjusting the galvanometer, the laser focus, and/or the laser power according to one embodiment of the invention is show.

One possible cause of the wafer not satisfying the control limits is that the XY-mirrors in the galvanometer are not aligned properly. This would result in an asymmetric annealing pattern over the block. At step 61 it is ensured that the mirrors of the galvanometer are aligned properly, so as to sweep the laser beam over a block symmetrically. If they are not, they are adjusted.

Another possible reason for the wafer not satisfying the control limits is if the surface brightness of all the blocks is either too dark or too light. This may be caused by the laser power having drifted from its nominal value, for example because of overheating or age. At step 62 the laser is allowed to cool, in case the laser power being different from its nominal value is due to overheating. At step 64 the laser power is also adjusted, if necessary, in order to bring it back to its nominal value.

Too light a surface brightness of all blocks may also be due to the laser being out of focus with respect to the surface of the wafer. At step 66 the initial wafer, which is still accepted for shipping to the end user, is replaced with a test wafer. The test wafer is a bare Si wafer. At step 68 the focus of the laser is tested. This is done by setting the focus offset at range of values, and for each value annealing a different portion the wafer. The surface brightness of each portion is measured, thereby associating each focus offset value with a measured surface brightness. The focus offset associated with a minimum surface brightness of the surface brightnesses is determined. If that focus offset is other than zero, then at step 70 the focus is adjusted by that focus offset. This can be done by either moving the laser or moving the stage.

Figure 7:
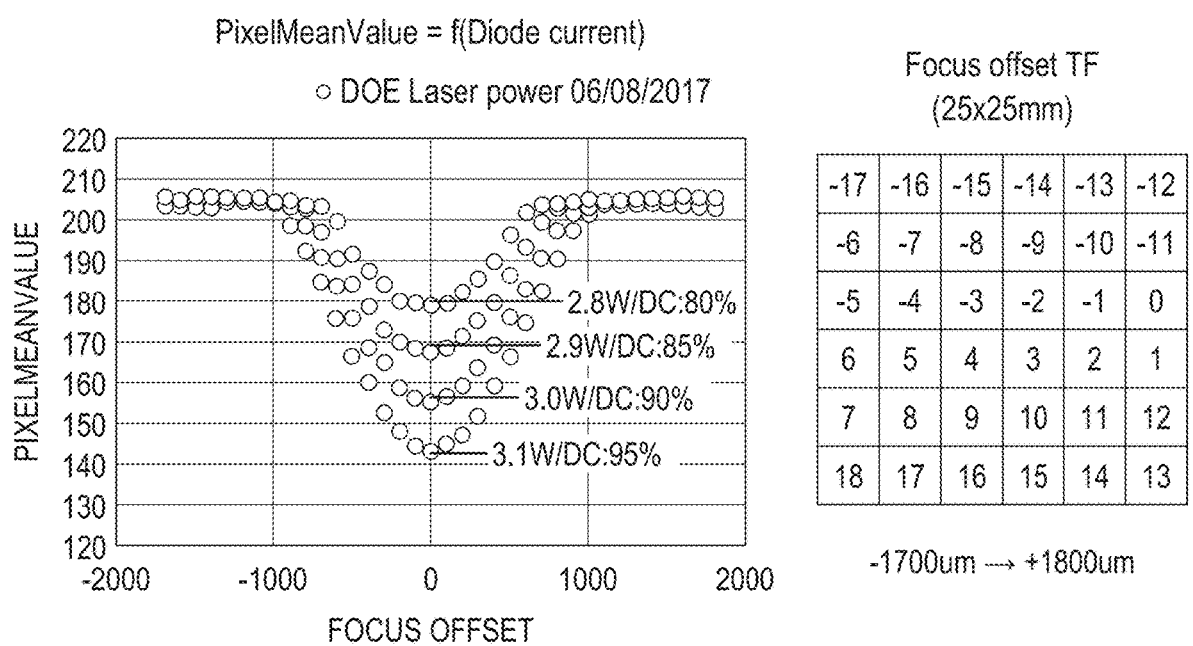
FIG. 7 shows an example plot of surface brightness as a function of focus offset for several laser powers.

An example is illustrated in FIG. 7. In FIG. 7, the focus was set at 1700 µm below the value of the focus when the laser is expected to be focused at the surface of the wafer. A portion of a 25 mm×25 mm block of a bare Si wafer is annealed. The galvanometer redirects the laser to a different portion of the wafer, the focus is raised by 100 µm, and the new portion of the wafer annealed. This was repeated until the laser focus was 1800 µm above what it was expected to be. The mean surface brightness of each portion was measured, and plotted against the focus offset corresponding to that portion. This was repeated for different laser powers. The minimum mean surface brightness occurs at the offset at which the laser is focused at the surface. In the example shown in FIG. 7, this occurs at a laser offset of 0, indicating that the laser is correctly focused at the surface of the wafer. If on the other hand the minimum brightness had occurred at a focus offset of −200 µm, for example, then the laser is focusing 200 µm away from where it is expected to be focusing. The laser is adjusted accordingly.

Testing of the laser focus, as described above with reference to steps 66 and 68, may also be performed separate from the manufacturing of wafers. Using a bare Si test wafer, testing of the laser focus can be monitored regularly, such as weekly, or following maintenance of the machine. In fact, testing of the galvanometer alignment and the laser power may also be carried out separately from the manufacturing of wafers using a bare Si test wafer. This allows the laser annealing tool to be monitored objectively and quantifiably outside of a manufacturing run, and adjusted if necessary.

The logic of the method steps relating to the surface brightness measurements and evaluations may be stored as instructions on a non-transitory computer-readable storage medium in a form executable by a computer processor. The logic of the steps may also be stored as instructions within a memory accessible by a processor, such that when read and executed by the processor they cause the processor to carry out the steps. The processor may be implemented by a general purpose processor, a network processor, a digital signal processor, an ASIC, or multiple such devices.

The embodiments presented are exemplary only and persons skilled in the art would appreciate that variations to the embodiments described above may be made without departing from the spirit of the invention. The scope of the invention is solely defined by the appended claims.

I claim:

1. A method of monitoring laser annealing of a semiconductor wafer, the method comprising:
    laser annealing the wafer using a laser;
    ensuring illumination conditions are at predefined conditions;
    measuring a plurality of surface brightnesses of the wafer, each measurement being at a different portion of the wafer;
    determining brightness statistics of the measured surface brightnesses; and
    using the brightness statistics to determine whether the wafer exhibits desired electrical characteristics, wherein using the brightness statistics comprises determining both whether the mean surface brightness over the entire wafer is within a brightness tolerance of a target brightness and whether the standard deviation of the measured brightnesses of the entire wafer being is below a threshold, and if so, determining that the wafer exhibits the desired electrical characteristics.

2. The method of claim 1, further comprising:
    if the wafer exhibits the desired electrical characteristics, determining whether the brightness statistics indicate that control limits have been exceeded, and if so, adjusting at least one of a galvanometer used to direct the laser, the power of the laser, and the focus of the laser.

3. The method of claim 2, wherein determining whether the brightness statistics indicate that control limits have been exceeded comprises:
    determining brightness statistics separately for each of a plurality of blocks on the surface of the wafer; and
    determining that the control limits have been exceeded if the brightness statistics of no block indicates that the block exhibits the desired electrical characteristics.

4. The method of claim 2, further comprising ensuring that mirrors in the galvanometer are aligned so as to sweep a beam from the laser symmetrically.

5. The method of claim 2, further comprising ensuring that the power of the laser is at a nominal value.

6. The method of claim 2, further comprising:
    replacing the wafer with a bare Si wafer;
    laser annealing each of a plurality of portions of the Si wafer at a different focus offset;
    measuring the surface brightness of each portion, thereby associating each focus offset with one of the measured surface brightnesses;
    determining the focus offset associated with a minimum surface brightness of the surface brightnesses; and
    if the focus offset associated with a minimum surface brightness of the surface brightnesses is other than zero, adjusting the focus by an amount equal to that focus offset.

7. The method of claim 2, further comprising:
    ensuring that mirrors in the galvanometer are aligned so as to sweep a beam from the laser symmetrically;
    ensuring that the power of the laser is at a nominal value;
    replacing the wafer with a bare Si wafer;
    laser annealing each of a plurality of portions of the Si wafer at a different focus offset;
    measuring the surface brightness of each portion, thereby associating each focus offset with one of the measured surface brightnesses;
    determining the focus offset associated with a minimum surface brightness of the surface brightnesses; and
    if the focus offset associated with a minimum surface brightness of the surface brightnesses is other than zero, adjusting the focus by an amount equal to that focus offset.

8. The method of claim 1, further comprising:
    determining desired surface brightness characteristics of the wafer from the desired electrical characteristics of the wafer and a correlation between surface brightness and electrical resistance; and
    wherein determining whether the wafer exhibits desired electrical characteristics comprises determining whether the wafer exhibits the desired surface brightness characteristics.

9. A method of monitoring a laser annealing tool, the method comprising:
    laser annealing, using a laser, each of a plurality of portions of a bare Si wafer;
    ensuring illumination conditions are at predefined conditions;
    measuring a plurality of surface brightnesses of the wafer, each measurement being at a different portion of the wafer;
    determining brightness statistics of the measured surface brightnesses; and
    using the brightness statistics to determine whether the laser annealing tool requires adjusting, wherein using the brightness statistics comprises determining both whether the mean surface brightness over the entire wafer is within a brightness tolerance of a target brightness and whether the standard deviation of the measured brightnesses of the entire wafer being is below a threshold, and if so, determining that the wafer exhibits the desired electrical characteristics.

10. The method of claim 9, wherein laser annealing each of a plurality of portions comprises laser annealing each of at least some of the portions at a different focus offset, and the method further comprising:
    measuring the surface brightness of each of these portions, thereby associating each focus offset with one of the measured surface brightnesses;
    determining the focus offset associated with a minimum surface brightness of the surface brightnesses; and
    if the focus offset associated with a minimum surface brightness of the surface brightnesses is other than zero, adjusting the focus by an amount equal to that focus offset.

11. The method of claim 9, further comprising:
    for each of a plurality of blocks, determining brightness statistics of the measured surface brightnesses of the portions within the block;

determining whether the brightness statistics of any block indicates that the block exhibits desired characteristics; and if the brightness statistics of no block indicates that the block exhibits the desired characteristics, adjusting mirrors in a galvanometer directing a beam from the laser such that the mirrors are aligned so as to sweep the beam symmetrically.

12. At least one non-transitory computer-readable medium comprising instructions that, when read by at least one processor, cause the at least one processor to:

determine brightness statistics of measured surface brightnesses of a laser annealed semiconductor wafer; and use the brightness statistics to determine whether the wafer exhibits desired electrical characteristics, wherein using the brightness statistics comprises determining both whether the mean surface brightness over the entire wafer is within a brightness tolerance of a target brightness and whether the standard deviation of the measured brightnesses of the entire wafer being is below a threshold, and if so, determining that the wafer exhibits the desired electrical characteristics.

13. The at least one non-transitory computer-readable medium of claim 12, further comprising instructions that, when read by the at least one processor, cause the at least one processor to determine desired surface brightness characteristics of the wafer from the desired electrical characteristics of the wafer using a correlation between surface brightness and electrical resistance.

14. The at least one non-transitory computer-readable medium of claim 12, further comprising instructions that, when read by the at least one processor, cause the at least one processor to:

determine brightness statistics separately for each of a plurality of blocks on the surface of the wafer; and determine that a tool used in annealing a wafer to create the laser annealed semiconductor wafer needs adjusting if the brightness statistics of no block indicates that the block exhibits the desired electrical characteristics.

* * * * *